United States Patent
Yao et al.

(10) Patent No.: US 6,770,847 B2
(45) Date of Patent: Aug. 3, 2004

(54) METHOD AND SYSTEM FOR JOULE HEATING CHARACTERIZATION

(75) Inventors: Huade W. Yao, Livermore, CA (US); Amit P. Marathe, Milpitas, CA (US); Van-Hung Pham, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 124 days.

(21) Appl. No.: 10/261,358

(22) Filed: Sep. 30, 2002

(65) Prior Publication Data

US 2004/0060916 A1 Apr. 1, 2004

(51) Int. Cl.[7] .............................................. G01R 31/26
(52) U.S. Cl. ...................... 219/209; 219/201; 324/719; 324/703; 438/15
(58) Field of Search ................................. 219/200–201, 219/494, 505; 324/719, 703; 438/14–18; 374/45

(56) References Cited

U.S. PATENT DOCUMENTS

| | | | | |
|---|---|---|---|---|
| 4,739,258 A | * | 4/1988 | Schwarz | 324/537 |
| 5,260,668 A | * | 11/1993 | Mallory et al. | 324/719 |
| 5,291,142 A | | 3/1994 | Ohmi | |
| 6,154,041 A | * | 11/2000 | Cheng | 324/758 |
| 6,329,262 B1 | * | 12/2001 | Fukuda et al. | 438/385 |
| 6,603,321 B2 | * | 8/2003 | Filippi et al. | 324/719 |

FOREIGN PATENT DOCUMENTS

| | | | |
|---|---|---|---|
| EP | 0 656 650 A | | 6/1995 |
| JP | 6-151537 | * | 5/1994 |
| JP | 6-209034 | * | 7/1994 |
| JP | 7-326647 | * | 12/1995 |

\* cited by examiner

Primary Examiner—John A. Jeffery
(74) Attorney, Agent, or Firm—Farjami & Farjami LLP

(57) ABSTRACT

According to one exemplary embodiment, a method for establishing a relationship between Joule heating in a conductor and a current density in the conductor is implemented by performing wafer level measurements. According to this exemplary embodiment, wafer level measurements are performed to arrive at a temperature coefficient of resistance in the conductor. The method also includes determining a thermal resistance of the conductor. The thermal resistance is then utilized to establish a relationship between Joule heating in the conductor and the current density in the conductor. The relationship so obtained is then utilized to determine design rules, mean time to fail, and other information to aid in the design of reliable semiconductor devices. According to another exemplary embodiment, a wafer level measurement system is utilized to establish a relationship between Joule heating in a conductor and a current density in the conductor.

20 Claims, 5 Drawing Sheets

METHOD AND SYSTEM FOR JOULE HEATING CHARACTERIZATION

TECHNICAL FIELD

The present invention is generally related to the field of semiconductors. More particularly, the present invention is related to method and system for Joule heating characterization in semiconductors.

BACKGROUND ART

In an effort to achieve increased speed, copper and low dielectric constant ("low-k") dielectrics are replacing aluminum and conventional dielectrics, such as silicon oxide, in state-of-the-art microprocessors and other semiconductor devices. By utilizing low-k dielectrics, semiconductor manufacturers advantageously achieve reduced inter-layer and intra-layer capacitance compared to the capacitance that results from the utilization of conventional dielectrics. However, low-k dielectrics are generally poor thermal conductors and result in increased "Joule heating" in copper metal layer and especially in upper metal layers.

By way of background, "Joule heating" is thermal energy that results from a current flow encountering resistance in a metal structure, such as an interconnect line in a semiconductor device. As temperature increases, resistance in the metal structure will increase as a result of an increased number of lattice collisions in the metal structure. Thus, Joule heating will further increase as the current increases because increased heat causes the resistance in the metal structure to increase. As a result of increased heat caused by Joule heating, the performance of the semiconductor device can be adversely affected.

Also, in the effort to achieve high speed, semiconductor manufacturers typically push the design of semiconductor devices to the limit by increasing current density to the maximum allowable amount. As a result, if the increase in heat caused by Joule heating is not taken into account in the design of the semiconductor device, the reliability of the semiconductor device can be detrimentally affected. Thus, semiconductor manufacturers are challenged to characterize Joule heating in semiconductor devices utilizing copper and low-k dielectrics and to allow for Joule heating in the design of those devices.

In a conventional approach, Joule heating is determined by performing a very large number of point by point measurements for a particular metal structure to obtain the amount of Joule heating corresponding to a certain quantity of current injected into the metal structure. Since a very large number of data points must be obtained by individual measurements, the process of determining the Joule heating corresponding to a very large number of injected currents for a particular structure is very time consuming. Furthermore, in a semiconductor device comprising a number of metal layers, the amount of Joule heating for each metal layer would have to be obtained individually utilizing the time consuming process described above for each metal layer.

Additionally, in the conventional approach, package level (also called oven level) measurements are utilized to obtain Joule heating data. To obtain package level measurements, a package containing a die must be cut for access and for Joule heating measurements. The package is then placed in an oven, current is injected into a test structure in the die within the package at a certain temperature, and a corresponding Joule heating, i.e. increase in temperature of the metal structure, is then determined at each data point corresponding to each current density. Package level measurements undesirably add additional time and expense to the process of obtaining Joule heating data, since the oven requires time to heat up and the dies containing the test structures must be cut and assembled into packages.

Thus, there is a need in the art for an efficient method and system for characterizing Joule heating in semiconductors.

SUMMARY

The present invention addresses and resolves the need in the art for an efficient method and system for characterizing Joule heating in semiconductors.

According to one exemplary embodiment, as a part of the present invention, a method for establishing a relationship between Joule heating in a conductor and a current density in the conductor is implemented by performing wafer level measurements. According to this exemplary embodiment, wafer level measurements are performed to arrive at a temperature coefficient of resistance in the conductor. The method also includes determining a thermal resistance of the conductor. The thermal resistance is then utilized to establish a relationship between Joule heating in the conductor and the current density in the conductor. The relationship so obtained is then utilized to determine design rules, mean time to fail, and other information to aid in the design of reliable semiconductor devices.

According to another exemplary embodiment, a wafer level measurement system is utilized to establish a relationship between Joule heating in a conductor and a current density in the conductor. The wafer level measurement system includes, among other things, a measuring device and a heating device. The heating device is utilized to heat a wafer having the conductor thereon while the measuring device is utilized to determine a change in a resistance of the conductor to arrive at the temperature coefficient of resistance of the conductor. The system then determines the thermal resistance of the conductor based on the temperature coefficient of resistance where the thermal resistance is utilized to establish the relationship between Joule heating and the current density in the conductor, and where the relationship so established is utilized to determine, among other things, mean time to fail and various design rules. Other features and advantages of the present invention will become more readily apparent to those of ordinary skill in the art after reviewing the following detailed description and accompanying drawings.

DETAILED DESCRIPTION OF THE INVENTION

The present invention is directed to method and system for Joule heating characterization. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
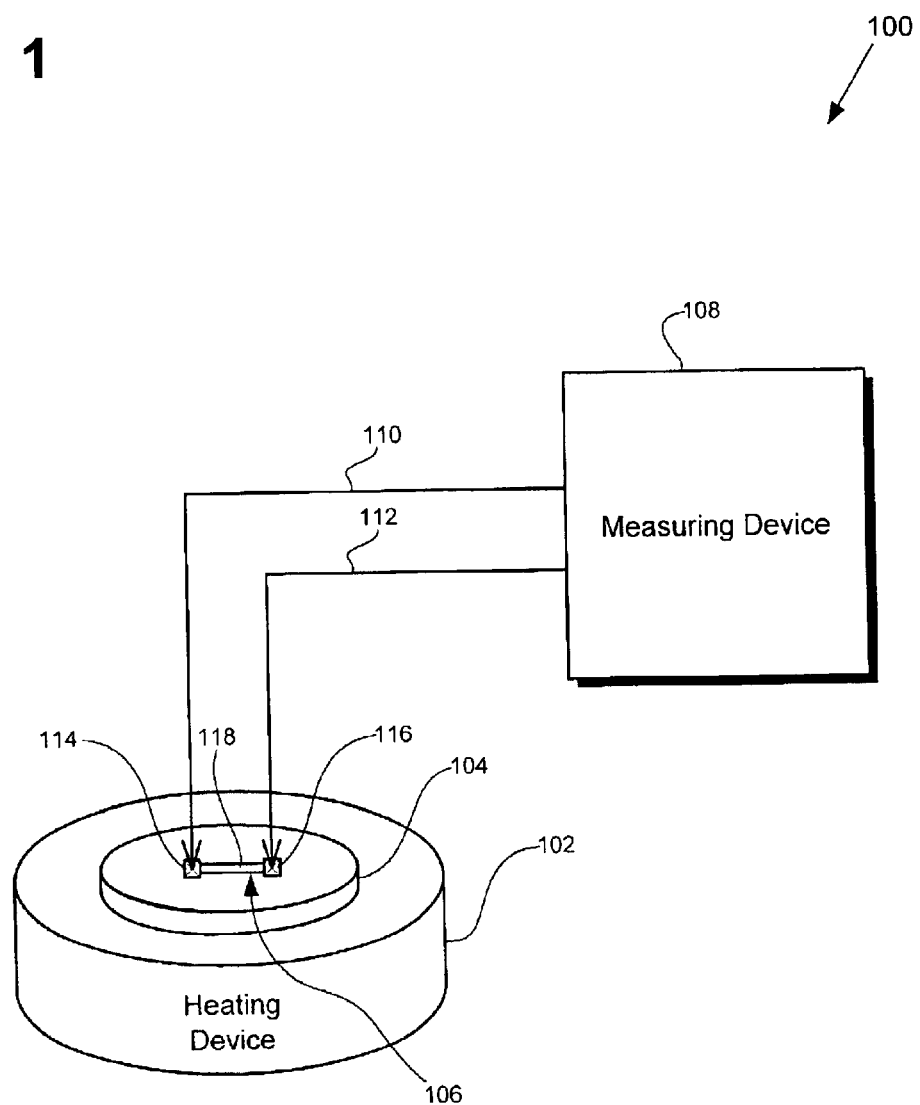
FIG. 1 illustrates a block diagram of an exemplary wafer level measurement system in accordance with one embodiment of the present invention.

FIG. 1 shows a diagram of an exemplary system for utilizing wafer level measurements for characterizing Joule heating in accordance with one embodiment of the present invention. Certain details and features have been left out of FIG. 1 that are apparent to a person of ordinary skill in the art. Wafer level measurement system 100 includes heating device 102, wafer 104, test structure 106, measuring device 108, and probes 10 and 112. Test structure 106 includes conductor 118 and test pads 114 and 116.

As shown in FIG. 1, wafer 104 is situated on heating device 102. Heating device 102 provides a means of heating wafer 104 to a desired temperature. Heating device 102 can be a hot plate or other appropriate device for controlling the temperature of wafer 104 as known in the art. In one embodiment, heating device 102 can be controlled by measuring device 108. Also shown in FIG. 1, wafer 104 includes test structure 106, which includes conductor 118 and test pads 114 and 116 situated at each end of conductor 118. Conductor 118 can comprise copper, aluminum, or other appropriate metal. Conductor 118 may be situated in any desired metal layer in test structure 106, such as metal layer 1 (also referred to as M1), metal layer 2 (also referred to as M2), metal layer 3 (also referred to as M3), or any higher metal layer, such as metal layer 8 (also referred to as M8). In addition to test structure 106, wafer 104 may also include other test structures not shown in FIG. 1. Further shown in FIG. 1, measuring device 108 is connected to test pads 114 and 116, respectively, by probes 110 and 112. Measuring device 108 can also utilize probes 110 and 112 to inject a current into conductor 118 by way of test pads 114 and 116, respectively, and measure the resistance of conductor 118.

Figure 2A:
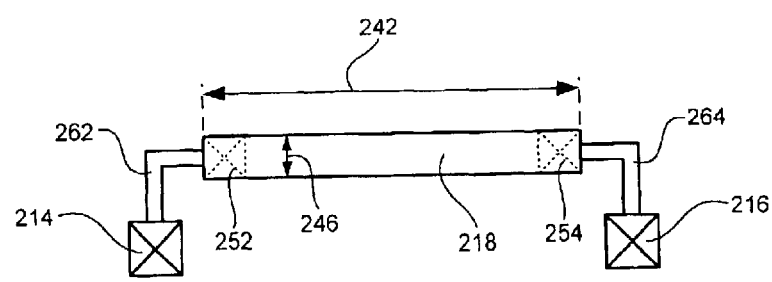
FIG. 2A illustrates a top view of an exemplary test structure in accordance with one embodiment of the present invention.

Referring now to FIG. 2A, an expanded top view of exemplary test structure 106 in FIG. 1, and in particular conductor 118, is shown. Test structure 206 in FIG. 2A corresponds to test structure 106 in FIG. 1 and includes conductor 218, vias 252 and 254, test pads 214 and 216, and routing lines 262 and 264. Conductor 218 and test pads 214 and 216 in FIG. 2A correspond to conductor 118 and tests pads 114 and 116 in FIG. 1, respectively. In a manner described in the present application, exemplary test structure 206 can be utilized to perform wafer level measurements to characterize Joule heating for a conductor at any metal layer, such as conductor 218, and to use such characterization to, among other things, determine mean time to fail ("MTF") and arrive at improved design rules. Test pads 214 and 216 can be connected to a measuring device, such as measuring device 108 in FIG. 1, to allow current to be inputted into conductor 218 and to measure the resistance of conductor 218.

Referring to FIG. 2A, it is further shown that a first end of conductor 218 is connected to via 252 and a second end of conductor 218 is connected to via 254. Also shown in FIG. 2A, through via 252 and routing line 262, the first end of conductor 218 is connected to test pad 214. Similarly, through via 254 and routing line 264, the second end of conductor 218 is connected to test pad 216. Width 246 of conductor 218 depends, among other things, on the particular technology, design rules, and the metal layer in which conductor 218 is formed. By way of an example, width 246 of conductor 218 can be between approximately 0.15 and 0.40 microns. By way of another example, length 242 of conductor 218 can be between approximately 250.0 and 800.0 microns. Conductor 218 may be situated in any desired metal layer, such as M1 to M8, or a higher metal layer.

Figure 2B:
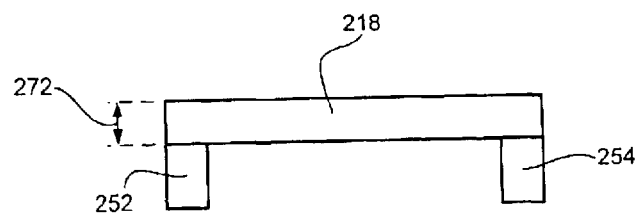
FIG. 2B illustrates a cross sectional view of a conductor and vias in the exemplary test structure of FIG. 2A.

FIG. 2B shows a cross sectional view of conductor 218 and vias 252 and 254 of FIG. 2A. As shown in FIG. 2B, a first end of conductor 218 is situated over via 252 and a second end of conductor 218 is situated over via 254. Thickness 272 of conductor 218 depends, among other things, on the particular technology and the metal layer in which conductor 218 is formed. By way of an example, thickness 272 of conductor 218 can be between approximately 0.20 and 0.4 microns.

Referring back to FIG. 1, in the present embodiment, measuring device 108 can be a computer controlled test instrument which is configured to measure a temperature increase caused by Joule heating in a conductor, such as conductor 118 in test structure 106, as a result of a current flowing through the conductor. In one embodiment, measuring device 108 includes a computer configured to perform calculations on data acquired through probes 110 and 1112 and further configured to display or otherwise output the final result of such calculations.

Due to a current flowing through conductor 118, the Joule heating effect causes additional temperature increase in conductor 118 in a manner described above. As a part of the present invention, wafer level measurements are utilized to advantageously establish a predictive relationship between the temperature increase caused by Joule heating and current density in conductor 118 without the previous requirement of a very large number of point by point measurement and without requiring package level measurements. In the present invention, the relationship between Joule heating and current density obtained through wafer level measurements described below, can be utilized to, among other things, devise design rules and determine mean time to fail ("MTF") of various semiconductor devices, such as microprocessors.

To establish a predictive relationship between Joule heating and current density in conductor 118 by utilizing wafer level measurements, the temperature coefficient of resistance ("TCR") is first determined for conductor 18 by utilizing the equation:

$$\frac{dR}{dT} = TCR \cdot R_0 \qquad \text{equation (1)}$$

where "$R_0$" is the resistance of conductor 18 at a reference temperature and "dR/dT" is the rate of resistance change in conductor 118 as temperature changes. The TCR of conductor 118 can be determined as described below in relation to FIG. 3.

Figure 3:
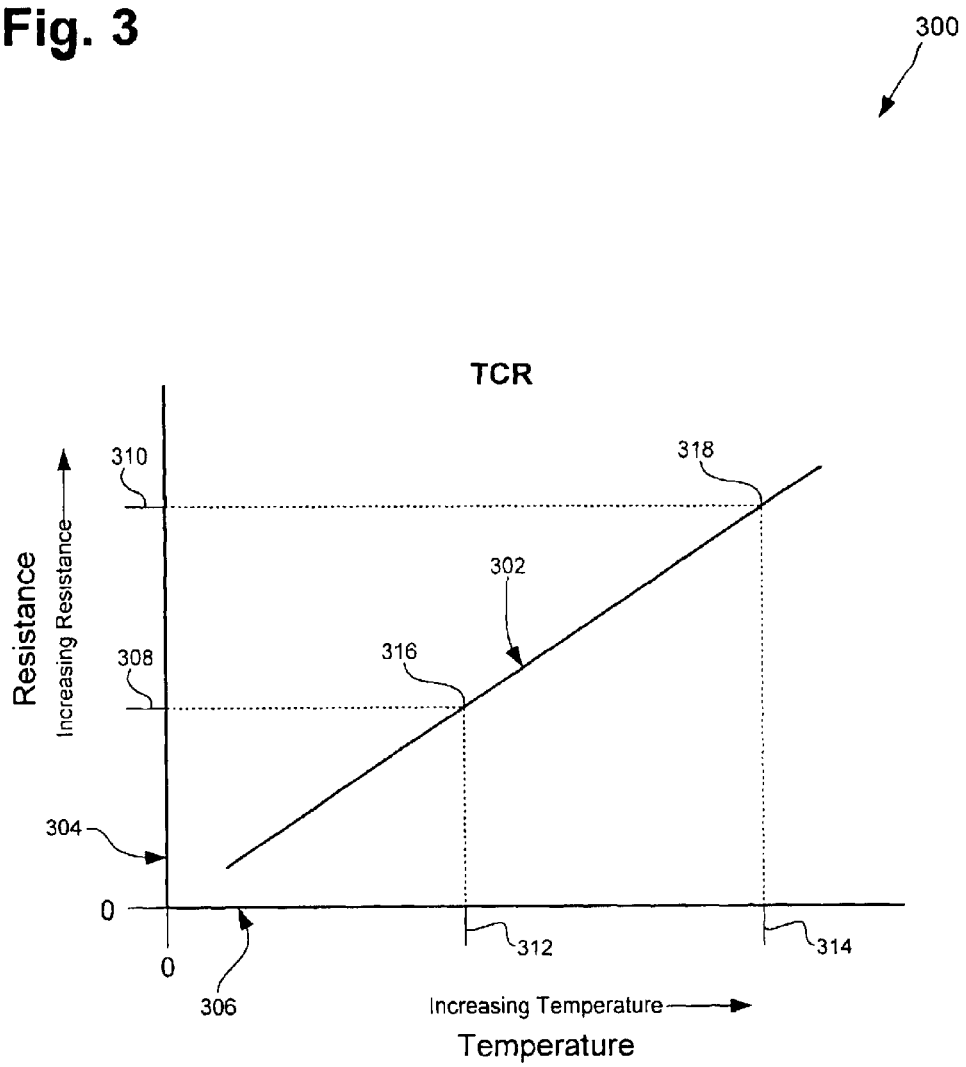
FIG. 3 is a graph showing an exemplary TCR line of an exemplary metal structure.

Referring now to FIG. 3, graph 300 shows an exemplary TCR line of an exemplary metal structure. The slope of TCR line 302 in graph 300 shows the rate of change of resistance versus the change of temperature for a metal structure, such as conductor 118, at a particular metal layer. Graph 300 includes resistance axis 304 and temperature axis 306. In graph 300, resistances 308 and 310 of a conductor, such as conductor 118, are measured at temperatures 312 and 314 to determine data points 316 and 318, respectively, which are used to plot line 302 and to determine the TCR of conductor 118, i.e. the slope of line 302. In other embodiments, different data points might be obtained to determine the TCR of a metal structure, such as conductor 118.

In the present embodiment, resistances 308 and 310 are measured at temperatures 312 and 314, respectively, at a wafer level, in contrast to a convention package level as discussed above. As a result of using wafer level measurements, TCR line 302 can be determined in much less time than would be required by package level measurements. The reason is that package level measurements require time for an oven to heat up and, further, the dies containing the test structures must be cut and assembled into packages. It is noted that although only resistances 308 and 310 and temperatures 312 and 314 are shown in graph 300 to preserve brevity, in other embodiments, a greater number of resistance data points of a metal structure, such as conductor 118, are measured at corresponding temperatures so as to generate a number of data points to plot TCR line 302 with a desired degree of accuracy.

Referring now to FIG. 1, thermal resistance, TR, of conductor 118 is defined by the equation:

$$TR = \frac{\Delta T_J}{\Delta P} \qquad \text{equation (2)}$$

where "$\Delta T_1$" is the temperature increase due to Joule heating of conductor 118 as a result of a current flowing through conductor 118 and "$\Delta P$" is the power consumed by conductor 118. "$\Delta P$" can be expressed by the equation:

$$\Delta P = I^2 \cdot R \qquad \text{equation (3)}$$

where "I" is the current inputted into conductor 118 and "R" is the resistance of conductor 118. "R" can be expressed by the equation:

$$R = \rho(T) \cdot \frac{L}{A} \qquad \text{equation (4)}$$

where "$\rho(T)$" is the resistivity of metal in conductor 118 at operating temperature "T"; "L" is the length of conductor 18; and "A" is the cross sectional area of conductor 118. Thermal resistance, TR, which is a characteristic of a conductor having fixed dimensions, can be determined as follows: TCR and $R_0$ are known from equation (1) and, by performing wafer level measurements using system 100 in FIG. 1, the change in resistance, i.e. dR, for a given injected current can be measured by measuring device 108, from which the change in temperature, i.e. dT, is ascertained from equation (1). The change in temperature, i.e., dT, can be thought of as "$\Delta T_J$" for use in equation (2). Since both "$\Delta T_J$" and "$\Delta P$" in equation (2) are known, TR can be derived therefrom.

Equation (2) can then be rewritten as:

$$\Delta T_J = TR \cdot I^2 \cdot R \qquad \text{equation (5)}$$

Using equation (4) to define resistance, R, equation (5) can then be written as:

$$\Delta T_J = TR \cdot I^2 \cdot \frac{\rho(T) \cdot L}{A} \qquad \text{equation (6)}$$

Since current density "J" is defined as "I/A," equation (6) can be expressed in terms of current density as:

$$\Delta T_J = TR \cdot J^2 \cdot \rho(T) \cdot (L \cdot A) \qquad \text{equation (7)}$$

since the volume of a conductor is equal to length multiplied by the cross sectional area of the conductor, equation (7) can be rewritten as:

$$\Delta T_J = (TR \cdot V) \cdot J^2 \cdot \rho(T) \qquad \text{equation (8)}$$

where "$\Delta T_J$" is the change in temperature of conductor 118 caused by Joule heating in conductor 118; "TR" is the characteristic thermal resistance of conductor 118 as defined above; "V" is the volume of conductor 118; "J" is the current density in conductor 118; and "$\rho(T)$" is the resistivity of conductor 18 at operating temperature "T". Thus, as part of the present invention, a relationship is established between Joule heating and current density in a metal structure as shown in equation (8). It is noted that equation (8), established as a part of the present invention, relates Joule heating to current density by relying on parameters that are physical characteristics of a conductor. In other words, parameters TR, V, and "$\rho(T)$" are physical characteristics of a given conductor and, as such, the relation between temperature increase due to Joule heating, i.e. "$\Delta T_J$", and current density is a unique relation for a given conductor since parameters TR, V, and "$\rho(T)$" are unique to each conductor. Moreover, as discussed above, none of the parameters TR, V, and "$\rho(T)$", requires package level measurements. Thus, as a part of the present invention, the relationship between Joule heating and current density for a given conductor in a certain metal layer is established utilizing solely wafer level measurements.

The relationship between Joule heating and current density in a conductor, established as a part of the invention, can be advantageously utilized to determine, among other things, MTF or to devise design rules as discussed below. By way of background, MTF is defined by Black's law, which is utilized to predict the mean time to fail of a semiconductor device, such as a microprocessor. Black's law is conventionally expressed by the equation:

$$MTF = A \cdot (J)^{-n} \cdot \exp\left(\frac{Ea}{k \cdot T}\right) \qquad \text{equation (9)}$$

where "MTF" is the mean tine to fail of a metal structure, such as conductor 18; "A" is the cross sectional area of the metal structure; "J" is the current density in the metal structure; "n" is a number that is dependant on the type of material that the metal structure comprises and can be, for example, between 1.0 and 2.0; "Ea" is the activation energy, which is an experimentally derived constant that relates to the particular type of defect, such as electromigration, that is being predicted; "k" is Boltzmann's constant, which relates the mean total energy of a molecule to its absolute temperature and is approximately equal to $1.38 \cdot 10^{-23}$ Joules per degree Kelvin; and "T" is the temperature at which the metal structure is being tested. However, the conventional expression of Black's law, as illustrated in equation (9) above, does not readily include the effect of Joule heating. As part of the present invention, Black's law can now advantageously include the effect of Joule heating as expressed in the equation:

$$MTF = A \cdot (J)^{-n} \cdot \exp\left(\frac{Ea}{k \cdot (T + \Delta T_J)}\right) \quad \text{equation (10)}$$

where "$\Delta T_J$" is the Joule heating term as expressed by equation (8) in the present invention. Thus, as a part of the present invention, Joule heating is expressed in measurable physical terms as discussed above and the effect of Joule heating can be advantageously included in Black's law as shown in equation (10). As a result, as a part of the present invention, equation (10) can be advantageously utilized to evaluate the reliability of metal structures, such as interconnects, in semiconductor devices. For example, equation (10) can be advantageously utilized to evaluate the reliability of interconnects in microprocessors for electromigration ("EM") failure. Thus, as a part of the present invention, the expected lifetime of semiconductor devices, such as microprocessors, can be more reliably predicted.

The present invention can also be advantageously utilized to devise design rules that include the effect of Joule heating. The volume of a metal line, such as conductor 118, can be expressed by the equation:

$$V = A \cdot L = W \cdot d \cdot L \quad \text{equation (11)}$$

where "A" is the cross sectional area of the metal line and "W," "d," and "L" are the width, thickness, and length of the metal line, respectively. By utilizing the expression for "V" in equation (11), equation (8) can be written as:

$$\Delta T_J = (TR \cdot W) \cdot (d \cdot L) \cdot J^2 \cdot \rho(T) \quad \text{equation (12)}$$

Equation (12) can be advantageously utilized to devise design rules for a metal line, such as conductor 118. Equation (12) can be rewritten as equation (13):

$$W = \frac{\Delta T_J}{TR \cdot (d \cdot L) \cdot J^2 \cdot \rho(T)} \quad \text{equation (13)}$$

Equation (13) can be advantageously utilized by a semiconductor designer to tune width "W" of a metal line to be within a Joule heating budget. Thus, by utilizing equations (12) and (13), the present invention advantageously allows semiconductor designers to consider the effect of Joule heating in devising design rules.

Figure 4:
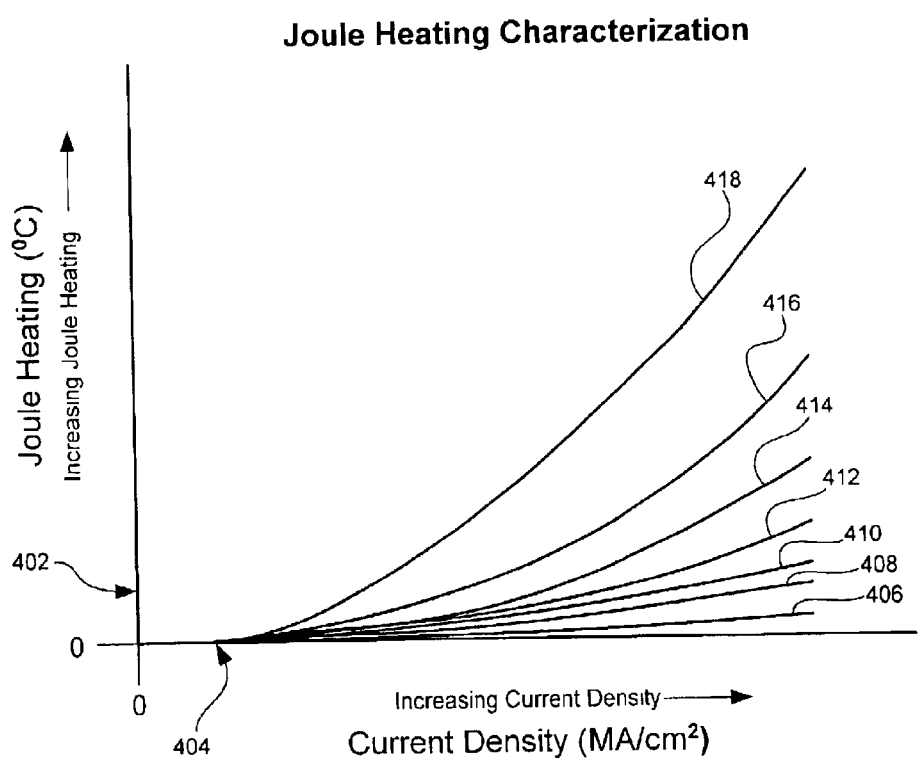
FIG. 4 is a graph showing exemplary Joule heating characterization curves in accordance with one embodiment of the present invention.

FIG. 4 shows exemplary graph 400 including exemplary Joule heating characterization curves in accordance with one embodiment of the present invention. Graph 400 includes Joule heating axis 402 and current density axis 404. Graph 400 also includes Joule heating characterization curves 406, 408, 410, 412, 414, 416, and 418. Joule heating characterization curves 406, 408, 410, 412, 414, 416, and 418, respectively, show a relative change in Joule heating versus increasing current density in respective conductors in metal layers M1, M2, M3, M4, M5, M7, and M8 utilizing wafer level measurements as well as the relationship between Joule heating and current density established as a part of present invention and set forth in equation (8) above. In the example shown in graph 400, at a particular current density, Joule heating increases for higher metal layers. For example, if a conductor in metal layer M5 has the same width, length, and current density as a conductor in metal layer M1, the conductor in metal layer M5 will exhibit increased Joule heating compared to the conductor in metal layer M1. The reason is that in the present example, and also in the typical case, higher metal layers, such as metal layer M5, have greater thickness, resulting in a greater "V" in equation (8), relative to lower metal layers, such as metal layer M1.

Thus, by utilizing wafer level measurements, the present invention advantageously achieves, among other things, a relationship between Joule heating and current density for conductors in any metal layer without requiring a very large number of experimentally determined data points, wherein such relationship is readily usable in arriving at MTF, design rules, or other valuable design information. In contrast, and for example, without the benefit of the present invention, conventional Joule heating characterization curves would require the very time consuming process of experimentally determining a very large number of data points to achieve accurate Joule heating characterization curves for various conductors in various metal layers.

Figure 5:
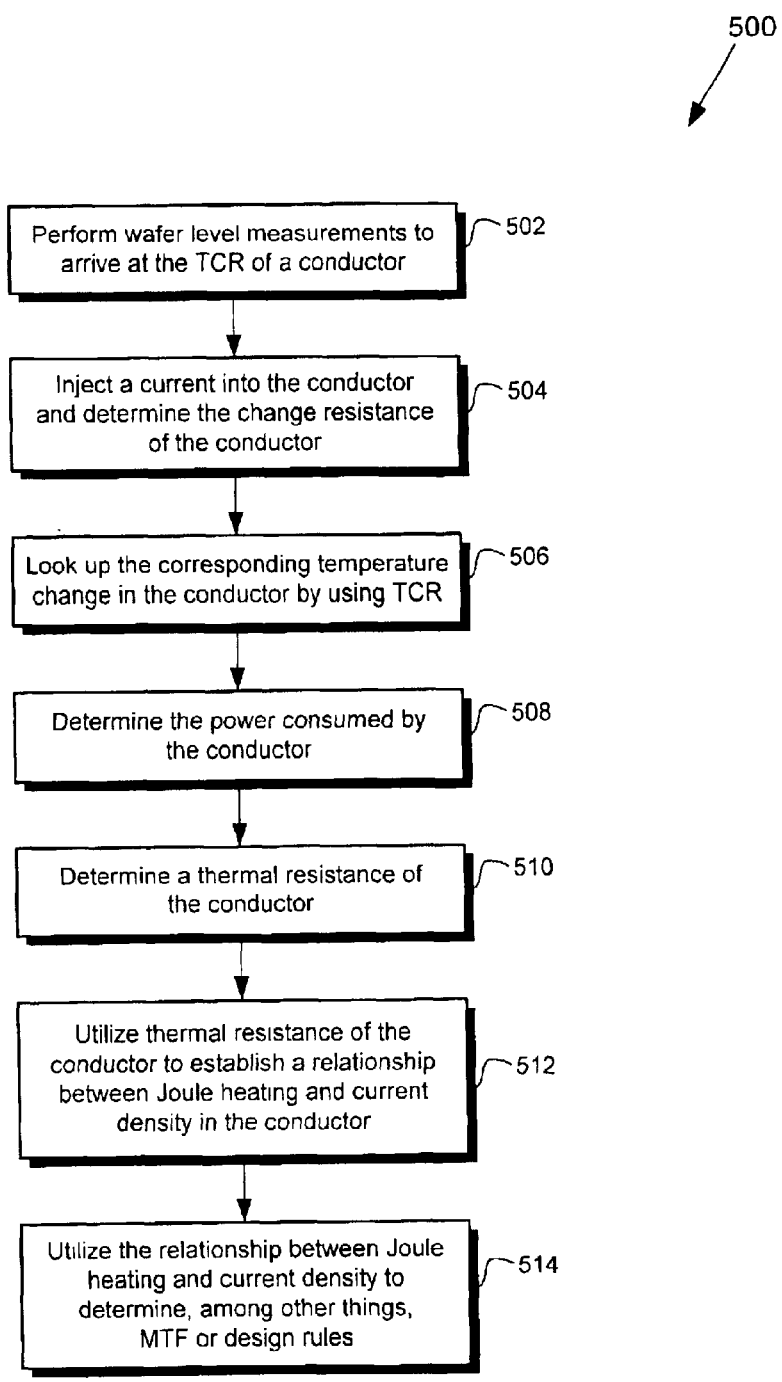
FIG. 5 is a flow chart corresponding to exemplary method steps according to one embodiment of the present invention.

Referring to FIG. 5, flow chart 500 illustrates an exemplary method according to an embodiment of the present invention. The following description of flow chart 500 includes references to wafer level measurement system 100 of FIG. 1 since the method steps in flow chart 500 are implemented utilizing a system such as wafer level measurement system 100. At step 502 of flow chart 500, wafer level measurements are performed to arrive at the TCR of conductor 118. For example, utilizing measuring device 108, resistance of conductor 1118 can be measured at two or more different temperatures to determine the TCR of conductor 118 in a manner explained above. At step 504, wafer level measurements are performed to determine change in resistance of conductor 118 as a result of an injected current. At step 506, from the change in resistance, the TCR, and $R_0$, the corresponding change in temperature is obtained from equation (1) above, i.e. by looking up the corresponding change in temperature in a graph such as graph 300 in FIG. 3. This change in temperature corresponds to "$\Delta T_J$". At step 508, the power consumed by conductor 118 can be determined, for example, by appropriately inputting the value of injected current and resistance of conductor 18 into equation (3).

At step 510, a thermal resistance of conductor 118 is determined. The thermal resistance, TR, of conductor 118 can be determined, for example, by inputting the value of the change in temperature of conductor 118, determined at step 506, and the value of the power consumed by conductor 118, determined at step 508, into equation (2). At step 512, the thermal resistance of conductor 118 is utilized to establish a relationship between Joule heating and current density in conductor 118. The relationship between Joule heating and current density in conductor 118 is indicated in equation (8). Thus, as a part of the present invention, a relationship between Joule heating and current density in conductor 118 is advantageously established, thereby allowing Joule heating characterization curves, such as Joule heating characterization curves in graph 400 of FIG. 4, to be generated without requiring a large number of experimentally determined data points. At step 514, the relationship between Joule heating and current density in conductor 118 established at step 512 is advantageously utilized to determine, among other things, MTF of conductor 118 or to devise design rules for conductors at various metal layers, such as for conductor 118. The MTF of conductor 118 can be determined by utilizing equation (10) in the present invention. Equation (10) can be advantageously utilized, for example, to evaluate the reliability of conductor 118 for electromigration failure. As another example, equations (12) and (13) in the present invention can be utilized to advantageously arrive at appropriate design rules and to tune the geometry of conductor 118, such as the width of conductor 118, to meet a desired Joule heating design budget.

Thus, as discussed above, the present invention advantageously achieves a predictive relationship between Joule heating and current density in a conductor thereby allowing Joule heating characterization curves of conductors in various metal layers to be determined, where the relationship between Joule heating and current density can be advantageously applied to, among other things, determine MTF or devise design rules to determine a geometry of a conductor in any metal layer.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method and system for Joule heating characterization have been described.

What is claimed is:

1. A method for establishing a relationship between Joule heating in a conductor and a current density in said conductor, said relationship being utilized to determine a geometry of said conductor, said method comprising steps of:
performing wafer level measurements to arrive at a temperature coefficient of resistance of said conductor;
determining a thermal resistance of said conductor;
utilizing said thermal resistance to establish said relationship between Joule heating in said conductor and said current density in said conductor;
utilizing said relationship to determine said geometry of said conductor.

2. The method of claim 1 further comprising a step of utilizing said relationship to determine a mean time to fail of said conductor after said step of utilizing said thermal resistance to establish said relationship.

3. The method of claim 1 further comprising a step of injecting a current in said conductor to determine a change in resistance of said conductor after said step of performing wafer level measurements and prior to said step of determining said thermal resistance.

4. The method of claim 3 further comprising a step of looking up a corresponding temperature change in said conductor by utilizing said temperature coefficient of resistance after said step of injecting said current in said conductor and prior to said step of determining said thermal resistance.

5. The method of claim 4 further comprising a step of determining a power consumed by said conductor after said step of looking up said corresponding temperature change in said conductor and prior to said step of determining said thermal resistance.

6. The method of claim 1 wherein said relationship between said Joule heating in said conductor and said current density in said conductor, is defined by:

$$\Delta T_J = (TR \cdot V) \cdot J^2 \cdot \rho(T).$$

7. The method of claim 1 wherein said geometry is determined by utilizing said relationship between said Joule heating in said conductor and said current density in said conductor to determine a width of said conductor.

8. A system for establishing a relationship between Joule heating in a conductor and a current density in said conductor, said relationship being utilized to determine a mean time to fail and to devise design rules for said conductor;
said system comprising a measuring device and a heating device;
said heating device heating a wafer comprising said conductor and said measuring device determining a change in a resistance of said conductor to arrive at a TCR of said conductor;
said system determining a thermal resistance of said conductor based on said TCR, said thermal resistance being utilized to establish said relationship between said Joule heating in said conductor and said current density in said conductor, wherein said relationship is utilized to determine said mean time to fail and to devise said devise rules for said conductor.

9. The system of claim 8 wherein said system is further utilized to inject a current in said conductor to determine said change in said resistance of said conductor.

10. The system of claim 8 wherein said system is further utilized to look up a corresponding temperature change in said conductor by utilizing said TCR.

11. The system of claim 8 wherein said system is further utilized to determine a power consumed by said conductor.

12. The system of claim 8 wherein said system is further utilized to arrive at said relationship between said Joule heating in said conductor and said current density in said conductor, such that said relationship is defined by:

$$\Delta T_J = (TR \cdot V) \cdot J^2 \cdot \rho(T).$$

13. The system of claim 8 wherein said design rules comprise a width of said conductor.

14. The system of claim 8 wherein said measuring device is configured to:
inject a current in said conductor; and
determine said thermal resistance of said conductor.

15. A system comprising a measuring device and a heating device, said system being utilized for establishing a relationship between Joule heating in a conductor and a current density in said conductor, said heating device heating a wafer comprising said conductor and said measuring device determining a change in a resistance of said conductor to arrive at a TCR of said conductor, said system being characterized in that:
said system is utilized to determine a thermal resistance of said conductor based on said TCR, said thermal resistance being utilized to establish said relationship between said Joule heating in said conductor and said current density in said conductor, wherein said relationship is utilized to determine a mean time to fail and to devise design rules for said conductor.

16. The system of claim 15 wherein said system is utilized to inject a current in said conductor to determine said change in said resistance of said conductor.

17. The system of claim 15 wherein said system is utilized to look up a corresponding temperature change in said conductor by utilizing said TCR.

18. The system of claim 15 wherein said system is utilized to determine a power consumed by said conductor.

19. The system of claim 15 wherein said measuring device is configured to:
   inject a current in said conductor; and
   determine said thermal resistance of said conductor.

20. The system of claim 15 further characterized in that said system is utilized to arrive at said relationship between said Joule heating in said conductor and said current density in said conductor, wherein said relationship is defined by:

$$\Delta T_J = (TR \cdot V) \cdot J^2 \cdot \rho(T).$$

* * * * *